US006846614B2

(12) United States Patent
Timpe et al.

(10) Patent No.: US 6,846,614 B2
(45) Date of Patent: Jan. 25, 2005

(54) ON-PRESS DEVELOPABLE IR SENSITIVE PRINTING PLATES

(75) Inventors: Hans-Joachim Timpe, Osterode/Harz (DE); Friederike Von Gyldenfeldt, Osterode (DE)

(73) Assignee: Kodak Polychrome Graphics LLC, Norwalk, CT (US)

( * ) Notice: Subject to any disclaimer, the term of this patent is extended or adjusted under 35 U.S.C. 154(b) by 168 days.

(21) Appl. No.: 10/066,874

(22) Filed: Feb. 4, 2002

(65) Prior Publication Data

US 2003/0157433 A1 Aug. 21, 2003

(51) Int. Cl.[7] ................................................ G03F 7/038

(52) U.S. Cl. ............................... 430/281.1; 430/282.1; 430/286.1; 430/287.1; 430/288.1; 430/302; 430/309; 430/434; 430/494; 430/944; 430/945; 430/964

(58) Field of Search ........................... 430/270.1, 271.1, 430/273.1, 281.1, 282.1, 286.1, 287.1, 288.1, 302, 309, 348, 401, 434, 494, 944, 945, 964

(56) References Cited

U.S. PATENT DOCUMENTS

| | | | | | |
|---|---|---|---|---|---|
| 4,228,232 | A | * | 10/1980 | Rousseau | 430/271.1 |
| 4,971,892 | A | * | 11/1990 | Ali et al. | 430/281.1 |
| 4,997,745 | A | | 3/1991 | Kawamura et al. | 430/281 |
| 5,204,222 | A | | 4/1993 | Gersdorf et al. | 430/281 |
| 5,491,046 | A | | 2/1996 | DeBoer et al. | 430/302 |
| 5,496,903 | A | | 3/1996 | Watanabe et al. | 526/204 |
| 5,545,676 | A | | 8/1996 | Palazzotto et al. | 522/15 |
| 5,599,650 | A | | 2/1997 | Bi et al. | 430/273 |
| 5,756,258 | A | | 5/1998 | Yamaoka et al. | 430/281 |
| 5,763,134 | A | | 6/1998 | Busman et al. | 430/157 |
| 5,800,965 | A | | 9/1998 | Tsuji et al. | 430/287 |
| 5,942,372 | A | * | 8/1999 | West et al. | 430/281.1 |
| 6,071,675 | A | | 6/2000 | Teng | 430/302 |
| 6,242,156 | B1 | | 6/2001 | Teng | 430/270.1 |
| 6,245,481 | B1 | | 6/2001 | Teng | 430/270 |
| 6,245,486 | B1 | | 6/2001 | Teng | 430/303 |
| 6,309,792 | B1 | * | 10/2001 | Hauck et al. | 430/270.1 |
| 2002/0197564 | A1 | * | 12/2002 | Timpe et al. | 430/284.1 |
| 2003/0003399 | A1 | * | 1/2003 | Muller et al. | 430/287.1 |
| 2003/0064318 | A1 | * | 4/2003 | Huang et al. | 430/270.1 |
| 2003/0118939 | A1 | * | 6/2003 | Munnelly et al. | 430/273.1 |

FOREIGN PATENT DOCUMENTS

| | | |
|---|---|---|
| DE | 19648313 | 5/1997 |
| EP | 0672544 | 9/1995 |
| EP | 0672954 | 9/1995 |
| EP | 0730201 | 9/1996 |
| EP | 0522175 | 11/1997 |
| EP | 0819985 | 1/1998 |
| EP | 1 106 381 A1 | 6/2001 |
| EP | 1117005 | 7/2001 |
| JP | 9-34110 | 2/1977 |
| JP | 11-38633 | 2/1999 |
| WO | 00/48836 | 8/2000 |

OTHER PUBLICATIONS

U.S. Appl. No. 09/832,989 (KP6 1109).
U.S. Appl. No. 09/828,457 (KP6 1129).

* cited by examiner

*Primary Examiner*—Barbara L. Gilliam
(74) *Attorney, Agent, or Firm*—Faegre & Benson LLP

(57) ABSTRACT

The present invention relates to IR-sensitive compositions suitable for the manufacture of printing plates developable on-press. The IR-sensitive compositions comprise a first polymeric binder which does not comprise acidic groups having a pKa value≦8; a second polymeric binder comprising polyether groups; an initiator system; and a free radical polymerizable system comprising at least one member selected from unsaturated free radical polymerizable monomers, free radical polymerizable oligomers and polymers containing C═C bonds in the back bone and/or in the side chain groups. The initiator system includes (i) at least one compound capable of absorbing IR radiation; (ii) at least one compound capable of producing radicals selected from polyhaloalkyl-substituted compounds; and (iii) at least one polycarboxylic acid of formula $R^4—(CR^5R^6)_r—Y—CH_2COOH$, wherein $ox_i < red_{ii} + 1.6$ eV, where $ox_i$=oxidation potential of component (i) in eV, and $red_{ii}$=reduction potential of component (ii) in eV.

31 Claims, No Drawings

ON-PRESS DEVELOPABLE IR SENSITIVE PRINTING PLATES

BACKGROUND OF THE INVENTION

1. Field of the Invention

The present invention relates to initiator systems and IR-sensitive compositions containing initiator systems. In particular, the present invention relates to printing plate precursors which can be developed on-press without requiring a preheat step or a separate development step.

2. Background of the Invention

Radiation-sensitive compositions are routinely used in the preparation of high-performance printing plate precursors. There are primarily two ways of improving the properties of radiation-sensitive compositions and thus also of the corresponding printing plate precursors. The first way addresses improvement of the properties of the radiation-sensitive components in the compositions (frequently negative diazo resins or photoinitiators). The other way deals with improvement of physical properties of the radiation-sensitive layers through the use of novel polymeric compounds ("binders").

The latest developments in the field of printing plate precursors deal with radiation-sensitive compositions which can be imagewise exposed by means of lasers or laser diodes. This type of exposure does not require films as intermediate information carriers since lasers can be controlled by computers.

High-performance lasers or laser diodes which are used in commercially available image-setters emit light in the wavelength ranges of between 800 to 850 nm and between 1060 and 1120 nm, respectively. Therefore, printing plate precursors, or initiator systems contained therein, which are to be imagewise exposed by means of such image-setters have to be sensitive in the near IR range. Such printing plate precursors can then basically be handled under daylight conditions which significantly facilitates their production and processing.

There are two possible ways of using radiation-sensitive compositions for the preparation of printing plates. For negative printing plates, radiation-sensitive compositions are used wherein after an imagewise exposure the exposed areas are cured. In the developing step, only the unexposed areas are removed from the substrate. For positive printing plates, radiation-sensitive compositions are used whose exposed areas dissolve faster in a given developing agent than the non-exposed areas. This process is referred to as photosolubilization.

Negative-working plates typically require after imagewise exposure require a preheating step, as described for example in EP-A-0 672 544, EP-A-0 672 954 as well as U.S. Pat. No. 5,491,046 and EP-A-0 819 985. These plates require a preheating step within a very narrow temperature range which only causes a partial crosslinking of the image layer. To meet current standards regarding the number of printable copies and the resistance to press room chemicals, an additional heating step—referred to herein as a preheat step—is carried out during which the image layer is crosslinked further.

The above systems have the additional disadvantage that a relatively high laser performance ($\geqq 150$ mJ/cm$^2$) is required; for some applications, such as newsprinting, this represents a disadvantage in view of the requirement of providing a certain number of exposed printing plates within a short period of time.

U.S. Pat. No. 4,997,745 describes photosensitive compositions comprising a dye absorbing between 300 and 900 nm and a trihalomethyl-s-triazine compound. However, these compositions required a development in aqueous developers.

In U.S. Pat. No. 5,496,903 and DE-A-196 48 313, photosensitive compositions are described which in addition to a dye absorbing in the IR range comprise borate co-initiators; also, halogenated s-triazines are described as further co-initiators. Although these compositions show an improved photosensitivity, the printing plates do not meet the requirement of a long shelf-life. After only one month of storage at room temperature, the entire layer of the printing plate is cured to such a degree that an image can no longer be created after exposure and developing of the plate.

Further photopolymerizable compositions with initiator systems are described in U.S. Pat. No. 5,756,258, U.S. Pat. No. 5,545,676, JP-A-11-038633, JP-A-09-034110, U.S. Pat. No. 5,763,134 and EP-B-0 522 175.

Radiation-sensitive compositions which show both a high degree of radiation sensitivity and a sufficiently long shelf-life when used in the manufacture of printing plate precursors are presently only known in connection with UV-absorbing dyes (EP-A-0 730 201). However, printing plate precursors using such compositions have to be manufactured and processed under darkroom conditions and cannot be imagewise exposed by means of the above-mentioned lasers or laser diodes. The fact that they cannot be processed in daylight limits their possibilities of application.

U.S. Pat. No. 6,245,486 discloses radiation sensitive printing plates, including on-press developable plates. However, this patent requires compositions having an IR ablatable mask layer over a UV addressable, negative-working, on press developable, free radical polymerizable layer.

U.S. Pat. No. 6,245,481 discloses IR-ablatable, UV-photopolymerizable two-layer compositions that require IR exposure followed by UV flood irradiation.

U.S. Pat. No. 5,599,650 discloses UV addressable, negative-working, on press developable printing plates based on free radical polymerization. This patent requires a free radical quencher polymer, specifically one containing nitroxide groups, in an overcoat layer to facilitate developability.

U.S. Pat. No. 6,071,675 discloses similar printing plates to U.S. Pat. No. 5,599,650 but additionally requires adding dispersed solid particles to the imaging layer to improve on-press developability or to reduce tackiness. The solid particles include phthalocyanine pigments, which are also used as IR absorbers.

U.S. Pat. No. 6,309,792 and WO 00/48836 describe IR-sensitive compositions comprising besides a polymeric binder and a free radically polymerizable system an initiator system comprising (a) at least one compound capable of absorbing IR radiation, (b) at least one compound capable of producing radicals and (c) at least one polycarboxylic acid comprising an aromatic moiety substituted with a heteroatom selected from N, O and S and at least two carboxyl groups, wherein at least one of the carboxyl groups is bonded to the heteroatom via a methylene group. The compositions may furthermore contain a colorant for increasing the contrast of the image compared to the background after development. The compositions of WO 00/48836 require a preheat step after the exposure for sufficient hardening of the compositions. The printing plate precursors must be developed with an aqueous developer.

U.S. application Ser. No. 09/832989 describes IR sensitive compositions containing leuco dyes additional to those described in U.S. Pat. No. 6,309,792 and WO 00/48836. U.S. application Ser. No. 09/832989 requires a preheat step after IR exposure and an aqueous development step for processing.

U.S. Pat. No. 5,204,222 teaches a composition comprising polymerizable ingredients in conjunction with a polymer binder comprising a polyurethane main chain. The side chains of the polymer binder do not comprise a polyethylene oxide chain.

U.S. Pat. No. 5,800,965 teaches a composition comprising monomers of polyethylene glycol as polymerizable components. The patent does not disclose the use of polyethylene oxide chains to prepare the polymeric binders.

EP 1,117,005 discloses photopolymerizable compounds which contain polyethylene oxide chains having 1–10 ethylene oxide units. The invention is exemplified by the use of polymers having one ethylene oxide unit. With more than ten ethylene oxide units, both resolution and water resistance of cured products decrease.

There is therefore a need in the art for a printing plate and process for preparing a printing plate that does not require a preheat step or a development step, and further does not require an IR-laser ablatable layer.

SUMMARY OF THE INVENTION

It is therefore one object of the present invention to provide an IR-sensitive composition comprising an IR-sensitive initiator system suitable for use in a negative-working printing plate.

It is another object of this invention to provide a printing plate precursor comprising (a) a substrate; (b) a negative-working bottom layer applied onto the substrate and comprising an IR-sensitive composition comprising a polymeric binder comprising polyether groups, and (c) an oxygen-impermeable top layer applied onto the bottom layer, wherein the printing plate precursor does not comprise an IR laser ablatable layer.

It is another object of this invention to provide a method for preparing an on-press developable printing plate, the method comprising (a) providing a substrate; (b) applying a negative-working bottom layer comprising an IR-sensitive composition onto the substrate to obtain a printing plate precursor, wherein the IR-sensitive composition comprises a polymeric binder comprising polyether groups; (c) applying an oxygen-impermeable top layer onto the bottom layer; (d) imagewise exposing the printing plate precursor obtained in step (b) to IR-radiation; and (e) developing on a press, wherein the method does not comprise a separate development step and does not comprise a separate heating step, and the printing plate does not comprise an IR laser ablatable layer.

This invention allows the manufacture of negative printing plate precursors having a long shelf-life, provides a continuously high number of copies and a high degree of resistance to press room chemicals, and is additionally characterized by an improved IR sensitivity.

DETAILED DESCRIPTION OF THE INVENTION

Preferably, the IR-sensitive composition of the printing plate precursor and printing plate of the invention comprises:

(a) a first polymeric binder which does not comprise acidic groups having a pKa value less than or equal to 8;

(b) a second polymeric binder comprising polyether groups;

(c) an initiator system comprising
  (i) at least one compound capable of absorbing IR radiation selected from triarylamine dyes, thiazolium dyes, indolium dyes, oxazolium dyes, cyanine dyes, polyaniline dyes, polypyrrole dyes, polythiophene dyes and phthalocyanine pigments;
  (ii) at least one compound capable of producing radicals selected from polyhaloalkyl-substituted compounds; and
  (iii) at least one polycarboxylic acid represented by the following formula I $$R^4—(CR^5R^6)_r—Y—CH_2COOH \qquad (I)$$

wherein Y is selected from the group consisting of O, S and $NR^7$, each of $R^4$, $R^5$ and $R^6$ is independently selected from the group consisting of hydrogen, $C_1$–$C_4$ alkyl, aryl which is optionally substituted, —COOH and $NR^8CH_2COOH$, $R^7$ is selected from the group consisting of hydrogen, $C_1$–$C_6$ alkyl, —$CH_2CH_2OH$, and $C_1$–$C_5$ alkyl substituted with —COOH, $R^8$ is selected from the group consisting of —$CH_2COOH$, —$CH_2OH$ and —$(CH_2)_2N(CH_2COOH)_2$ and r is 0, 1, 2 or 3 with the proviso that at least one of $R^4$, $R^5$, $R^6$, $R^7$ and $R^8$ comprises a —COOH group or salts thereof; and (d) a free radical polymerizable system comprising at least one member selected from unsaturated free radical polymerizable monomers, oligomers which are free radical polymerizable and polymers containing C═C bonds in the back bone and/or in the side chain groups, wherein the following inequality is met:

$$ox_i < red_{ii} + 1.6\ eV$$

with $ox_i$=oxidation potential of component (i) in eV
$red_{ii}$=reduction potential of component (ii) in eV.

Preferably, the initiator system of the present invention acts as a photonic initiator system.

The printing plate precursor of present invention comprises a bottom and a top layer. Preferably, the bottom layer comprises the IR-sensitive composition. Preferably, the top layer comprises:

(a) a polymer; and (b) an oxygen-impermeable compound.

The term "oxygen-impermeable compound" is intended to mean a compound that prevents the diffusion of oxygen from the atmosphere into the layer during the lifetime of the radicals generated by IR exposure. Preferably, the oxygen-impermeable compound and the polymer of the top layer of the printing plate precursor are the same compound.

Preferably, the top layer does not comprise quencher polymers. The use of a quencher polymer in the top layer may lead to less satisfactory performance of the printing plates as discussed in Comparative Example 2 herein.

Component (a) of the IR-sensitive composition, the polymeric binder which does not comprise acidic groups having a pKa value of ≦8, preferably comprises side chains comprising at least one group selected from —COOR, —CONHR and —$NR^{12}COOR^{13}$ groups. The polymer main chain of component (a) may also contain at least one of ester groups and urethane groups. Optionally, at least one of the substituents R, $R^1$ or $R^2$ may contain a C═C unsaturated unit. Preferably, the polymeric binder (a) has a weight-average molecular weight in the range of 10,000 to 1,000,000 (determined by means of gel permeation chromatography. All these polymers are known in the art.

The polymers containing ester groups can be prepared by free radical polymerization or copolymerization of monomers. Examples of monomers that can be used as the copolymerizing component include acrylates and methacrylates each having an aliphatic hydroxyl group, such as 2-hydroxyethyl acrylate or 2-hydroxyethyl methacrylate, or having an aliphatic alkyl group such as methylacrylate, methylmethacrylate, N-dimethylaminoethylacrylate or N-dimethylaminoethylmethacrylate. For the preparation of amido group containing polymers, acrylamides or methacrylamides such as acrylamide, methacrylamide, N-methylolacrylamide, N-hydroxyethylacrylamide or N-ethylacrylamide can be used as monomers for polymerization.

Component (a) may also be a polyester or a polyurethane. As monomeric components of the polyesters, multifunctional acids or their anhydrides and multifunctional alcohols are used. Examples are maleic acid, maleic acid anhydrides, ethylene glycol and isomers of butanediol. The polyurethanes are commonly synthesized using diols and difunctional isocyanates.

Component (a) is preferably present in the IR-sensitive composition in an amount ranging from about 20 to about 50 wt.-% based on the total solids content of the IR-sensitive composition, more preferably in an amount ranging from about 25 to about 35 wt.-%.

In component (b) of the IR-sensitive composition, the polyether groups of the polymeric binders make the binders hydrophilic and render the IR-sensitive composition developable in fountain solution or ink emulsions. Such polymeric binders comprising polyether groups are known in the art and discussed, for example, in U.S. Pat. No. 5,258,263.

Preferably, the polyethers are derived from polyoxy alkylenes. Suitable polyoxy alkylenes from which the polyethers are derived include ethylene oxide and propylene oxide. Preferably, the polyethers comprise at least one end group selected from the group consisting of —OH, —OR, RCONH—, and $SiR_2OR$ groups. In one preferred embodiment, the polyoxy alkylene chain contains a minimum of 12 ethylene oxide units. For example, the ethylene oxide content in a chain of PLURONIC® L43 (available from BASF), shown in Table 1 herein, is 12.5 units.

A preferred class of polyether polymers is the class of polyalkylene ether glycols, that is, polyethers where the end groups are —OH. These compounds include both homopolymers and copolymers, such as block copolymers. Particularly preferred are those polyalkylene ether glycols which can be obtained by reacting of propylene oxide, ethylene oxide, or a combination thereof with hydroxyl groups of propylene glycol, ethylene glycol, glycerol, hexanetriol or sorbitol, and with the amino groups of ethylenediamine or the like. Examples of such polymers are polyethylene ether glycol, polypropylene ether glycol, and poly-1,2-dimethylethylene ether.

Component (b) is preferably present in the IR-sensitive composition in an amount ranging from about 3 to about 30 wt.-% based on the total solids content of the IR-sensitive composition, more preferably in an amount ranging from about 10 to about 20 wt.-%.

Useful infrared absorbing compounds typically have a maximum absorption wave length in some part of the electromagnetic spectrum greater than about 750 nm; more particularly, their maximum absorption wavelength is in the range from 800 to 1100 nm.

The initiator system, which is component (c) of the IR-sensitive composition, comprises a first component (component (i)) which is preferably a cyanine dye. It is more preferred that component (i) is a cyanine dye of the formula (A)

(A)

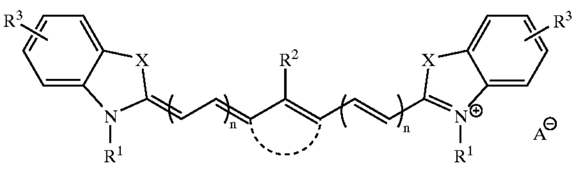

wherein each X is independently S, O, NR or $C(alkyl)_2$; each $R^1$ is independently an alkyl group, an alkylsulfonate or an alkylammonium group; $R^2$ is hydrogen, halogen, SR, $SO_2R$, OR or $NR_2$; each $R^3$ is independently a hydrogen atom, an alkyl group, COOR, OR, SR, $NR_2$, a halogen atom or an optionally substituted benzofused ring; A is an anion; the dashed line (---) completes an optional carbocyclic five- or six-membered ring; each R is independently hydrogen, an alkyl or aryl group; and each n is independently 0, 1, 2 or 3. In preferred embodiments of the invention, X is a $C(alkyl)_2$ group, $R^1$ is an alkyl group with 1 to 4 carbon atoms, $R^2$ is SR, $R^3$ is a hydrogen atom, and R is an alkyl or aryl group, most preferably a phenyl group; the dashed line represents the remainder of a ring with 5 or 6 carbon atoms; and the counterion A is a chloride ion or a tosylate anion.

If $R^1$ is an alkylsulfonate group, then either $A^-$ is absent and an inner salt is formed, or an alkali metal cation is present as a counterion. If $R^1$ is an alkylammonium group, a second anion is necessary as a counterion. The second anion may be the same as $A^-$ or a different one.

The cyanine dyes of the invention absorb in the range of 750 to 1100 nm; dyes of the formula (A) which absorb in the range of 810 to 860 nm are preferred.

Especially preferred are IR dyes with a symmetrical formula (A). Examples of such especially preferred dyes include:

2-[2-[2-phenylsulfonyl-3-[2-(1,3-dihydro-1,3,3-trimethyl-2H-indol-2-ylidene)-ethylidene]-1-cyclohexen-1-yl]-ethenyl]-1,3,3-trimethyl-3H-indolium chloride, 2-[2-[2-thiophenyl-3-[2-(1,3-dihydro-1,3,3-trimethyl-2H-indol-2-ylidene)-ethylidene]-1-cyclopenten-1-yl]-ethenyl]-1,3,3-trimethyl-3H-indolium tosylate, 2-[2-[2-chloro-3-[2-ethyl-(3H-benzothiazole-2-ylidene)-ethylidene]-1-cyclohexen-1-yl]-ethenyl]-3-ethyl-benzothiazolium tosylate, 2-[2-[2-chloro-3-[2-(1,3-dihydro-1,3,3-trimethyl-2H-indol-2-ylidene)-ethylidene]-1-cyclohexen-1-yl]-ethenyl]-1,3,3-trimethyl-3H-indolium tosylate, and 2-[2-[2-thiophenyl-3-[2-(1,3-dihydro-1,3,3-trimethyl-2H-indol-2-ylidene)-ethylidene]-1-cyclohexen-1-yl]-ethenyl]-1,3,3-trimethyl-3H-indolium chloride, reproduced below as structure A1:

A1

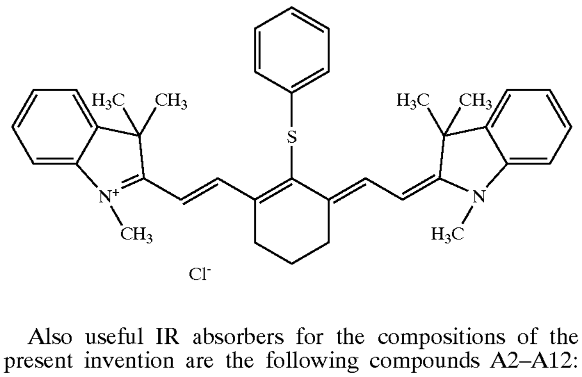

Also useful IR absorbers for the compositions of the present invention are the following compounds A2–A12:

A2
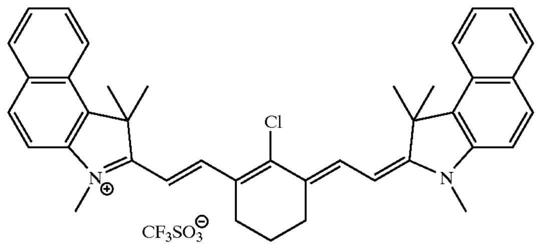
A3
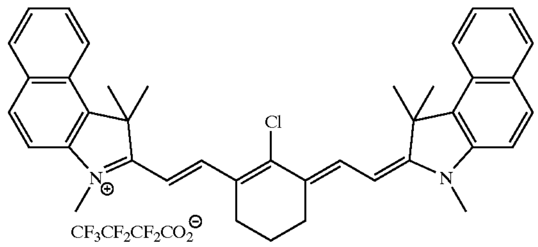
A4
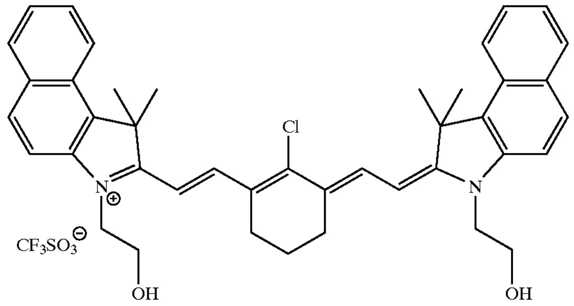
A5
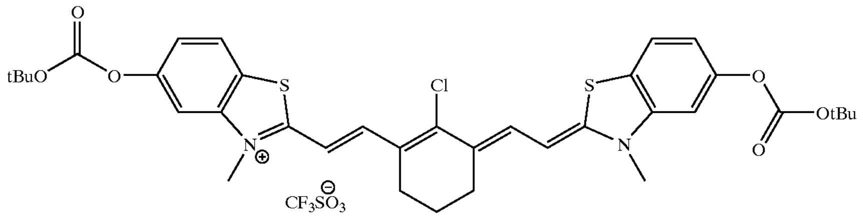
A6
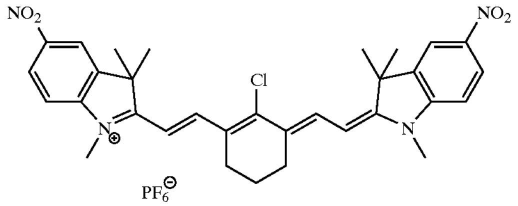
A7
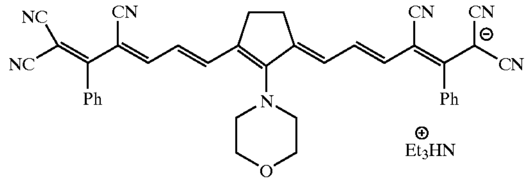
A8
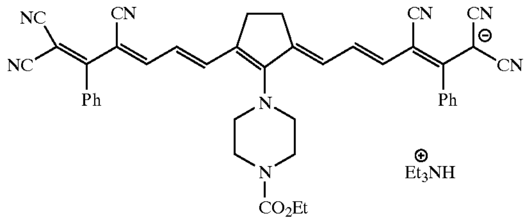
A9
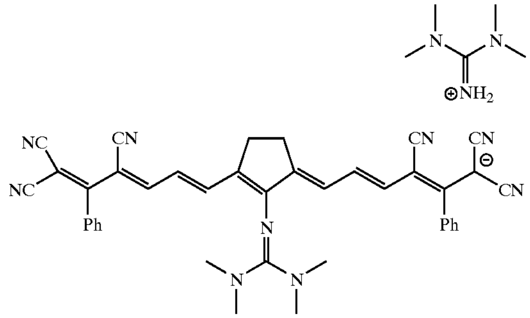
A10
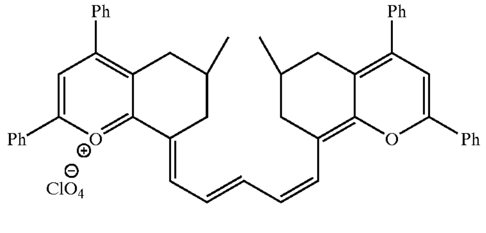
A11
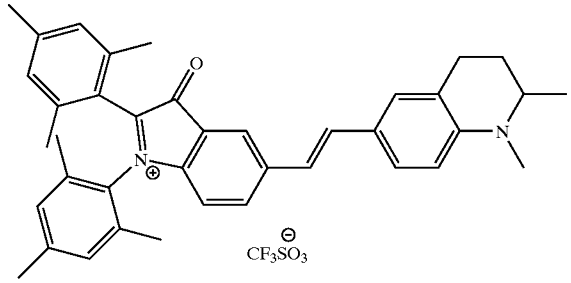

-continued

A12

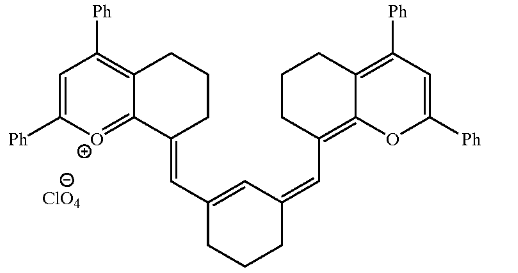

IR absorbing compound (i) is preferably present in the IR-sensitive composition in an amount ranging from about 0.5 to about 8 wt.-%, based on the total solids content of the IR-sensitive composition, more preferably in an amount ranging from about 1 to about 2 wt.-%.

Component (ii) of the initiator system, the compound capable of producing radicals, is selected from polyhaloalkyl-substituted compounds. These are compounds which comprise either at least one polyhalogenated alkyl substituent or several monohalogenated alkyl substituents. The halo genated alkyl substituent preferably has 1 to 3 carbon atoms; especially preferred is a polyhalogenated methyl group.

The absorption properties of the polyhaloalkyl-substituted compound fundamentally determine the daylight stability of the IR-sensitive composition. Compounds having a UV/visible absorption maximum of >330 nm result in compositions which can no longer be completely developed on-press after the printing plate has been kept in daylight for 6 to 8 minutes. In principle, such compositions can be imagewise exposed not only with IR but also with UV radiation. If a high degree of daylight stability is desired, polyhaloalkyl-substituted compounds are preferred which do not have a UV/visible absorption maximum at >330 nm.

Examples of compounds especially suitable as component (ii) include 2-(4-methoxyphenyl)-4,6-bis(trichloromethyl)-s-triazine, 2-(4-chlorophenyl)-4,6-bis-(trichloro-methyl)-s-triazine, 2-phenyl-4,6-bis(trichloromethyl)-s-triazine, 2,4,6-tri-(trichloromethyl)-s-triazine, 2,4,6-tri-(tribromomethyl)-s-triazine, and tribromomethyl phenylsulfone.

Component (ii) is preferably present in the IR-sensitive composition in an amount ranging from about 2 to about 15 wt.-% based on the total solids content of the IR-sensitive composition, more preferably in an amount ranging from about 4 to about 7 wt.-%.

Component (iii) of the initiator system, the polycarboxylic acid, is represented by the following formula I $$R^4\text{—}(CR^5R^6)_r\text{—}Y\text{—}CH_2COOH \qquad (I)$$

wherein Y is selected from the group consisting of O, S and $NR^7$, each of $R^4$, $R^5$ and $R^6$ is independently selected from the group consisting of hydrogen, $C_1$–$C_4$ alkyl, aryl which is optionally substituted, —COOH and $NR^8CH_2COOH$, $R^7$ is selected from the group consisting of hydrogen, $C_1$–$C_6$ alkyl, —$CH_2CH_2OH$, and $C_1$–$C_5$ alkyl substituted with —COOH, $R^8$ is selected from the group consisting of —$CH_2COOH$, —$CH_2OH$ and —$(CH_2)_2N(CH_2COOH)_2$ and r is 0, 1, 2 or 3 with the proviso that at least one of $R^4$, $R^5$, $R^6$, $R^7$ and $R^8$ comprises a —COOH group or salts thereof.

As used herein the term "alkyl" includes straight chain and branched chain alkyl groups unless otherwise defined.

As used herein the term "aryl" refers to carbocyclic aromatic groups and heterocyclic aromatic groups wherein one or more heteroatoms independently selected from N, O and S are present in the aromatic ring system. Examples for carbocyclic aromatic groups are phenyl and naphthyl.

As used herein the expression "aryl which is optionally substituted" refers to an aryl group as defined above which optionally comprises one or more substituents independently selected from the group consisting of —COOH, —OH, $C_1$–$C_6$ alkyl, —CHO, —$NH_2$, halogen (i.e. fluorine, chlorine, bromine and iodine), $C_1$–$C_4$ alkoxy, acetamido, —$OCH_2COOH$, —$NHCH_2COOH$ and aryl.

Examples of such polycarboxylic acids include the following:

(p-acetamidophenylimino)diacetic acid
3-(bis(carboxymethyl)amino)benzoic acid
4-(bis(carboxymethyl)amino)benzoic acid
2-[(carboxymethyl)phenylamino]benzoic acid
2-[(carboxymethyl)phenylamino]-5-methoxybenzoic acid
3-[bis(carboxymethyl)amino]-2-naphthalenecarboxylic acid
N-(4-aminophenyl)-N-(carboxymethyl)glycine
N,N'-1,3-phenylenebisglycine
N,N'-1,3-phenylenebis[N-(carboxymethyl)]glycine
N,N'-1,2-phenylenebis[N-(carboxymethyl)]glycine
N-(carboxymethyl)-N-(4-methoxyphenyl)glycine
N-(carboxymethyl)-N-(3-methoxyphenyl)glycine
N-(carboxymethyl)-N-(3-hydroxyphenyl)glycine
N-(carboxymethyl)-N-(3-chlorophenyl)glycine
N-(carboxymethyl)-N-(4-bromophenyl)glycine
N-(carboxymethyl)-N-(4-chlorophenyl)glycine
N-(carboxymethyl)-N-(2-chlorophenyl)glycine
N-(carboxymethyl)-N-(4-ethylphenyl)glycine
N-(carboxymethyl)-N-(2,3-dimethylphenyl)glycine
N-(carboxymethyl)-N-(3,4-dimethylphenyl)glycine
N-(carboxymethyl)-N-(3,5-dimethylphenyl)glycine
N-(carboxymethyl)-N-(2,4-dimethylphenyl)glycine
N-(carboxymethyl)-N-(2,6-dimethylphenyl)glycine
N-(carboxymethyl)-N-(4-formylphenyl)glycine
N-(carboxymethyl)-N-ethylanthraniic acid
N-(carboxymethyl)-N-propylanthranilic acid
N-(carboxymethyl)-N-benzyl-glycine
5-bromo-N-(carboxymethyl)anthranilic acid
N-(2-carboxyphenyl)glycine
o-dianisidine-N,N,N',N'-tetraacetic acid
4-carboxyphenoxyacetic acid
catechol-O,O'-diacetic acid
4-methylcatechol-O,O'-diacetic acid resorcinol-O,O'-diacetic acid
hydroquinone-O,O'-diacetic acid
α-carboxy-o-anisic acid
4,4'-isopropylydenediphenoxyacetic acid
2,2'-(dibenzofuran-2,8-diyldioxy)diacetic acid
2-(carboxymethylthio)benzoic acid
5-amino-2-(carboxymethylthio)benzoic acid
3-[(carboxymethyl)thio]-2-naphthalenecarboxylic acid
ethylene diamine tetra-acetic acid
nitrilo tri-acetic acid
diethylene triamine penta-acetic acid
N-hydroxyethyl ethylene diamine tri-acetic acid.

A preferred group of polycarboxylic acids are N-arylpolycarboxylic acids and N-arylalkylpolycarboxylic acids. Especially preferred are polycarboxylic acids of the formula (B)

(B)

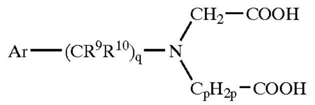

wherein Ar is a mono-, poly- or unsubstituted aryl group, p is an integer from 1 to 5, $R^9$ and $R^{10}$ are independently selected from the group consisting of hydrogen and $C_1$–$C_4$ alkyl and q is 0 or an integer from 1 to 3,
and of the formula (C)

(C)

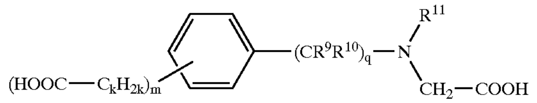

wherein $R^{11}$ represents a hydrogen atom or a $C_1$–$C_6$ alkyl group, k and m independently represent an integer from 1 to 5, and $R^9$, $R^{10}$ and q are as defined above.

A further preferred group of polycarboxylic acids are aliphatic poly-acetic acids with all —$CH_2COOH$ groups being bonded to one or more nitrogen atoms. Examples include ethylenediamine tetra-acetic acid, nitrilo tri-acetic acid, diethylene triarnine penta-acetic acid and N-hydroxyethyl ethylenediamine tri-acetic acid.

Preferred substituents of the aryl group in formula (B) are $C_1$–$C_3$ alkyl groups, $C_1$–$C_3$ alkoxy groups, $C_1$–$C_3$ thioalkyl groups and halogen atoms. The aryl group can have between one and three identical or different substituents. The value of p is preferably 1. Ar is preferably a phenyl group. In formulae (B) and (C), $R^9$ and $R^{10}$ are preferably independently selected from hydrogen and methyl; more preferably $R^9$ and $R^{10}$ are both hydrogen. The value of q is preferably 0 or 1. The value of each of k and m is preferably 1 or 2. $R^{11}$ is preferably hydrogen, methyl or ethyl.

The most preferred aromatic polycarboxylic acids are anilino diacetic acid and N-(carboxymethyl)-N-benzylglycine.

The polycarboxylic acid is preferably present in the IR-sensitive composition in an amount ranging from about 1 to about 10 wt.-%, more preferably from about 1.5 to about 3 wt.-%, based on the total solids content of the IR-sensitive composition.

Without wishing to be bound by any particular theory, and recognizing that the exact mechanism of the initiator system is not known with certainty, it is presently believed that in order to achieve a high degree of radiation sensitivity, the presence of all components (i)–(iii) of the initiator system is indispensable. The generation of free radicals starts with an electron transfer process between the excited IR dye molecule (component (i)) and the polyhaloalkyl compound (component (ii)). It was found that completely radiation-insensitive compositions were obtained when component (ii) was missing. The polycarboxylic acid (iii) is also necessary to obtain the required thermal stability of a radiation-sensitive composition. If the polycarboxylic acid is replaced for example by compounds having a mercapto group or by ammonium borates the radiation sensitivity can be slightly decreased, and the thermal stability of compositions containing borates can be insufficient.

It was found that it is important for the present invention that the oxidation potential of the compound capable of absorbing IR radiation (component (i)) is less than the reduction potential of the used polyhaloalkyl-substituted compound (component (ii)) plus 1.6 eV.

The unsaturated free radical polymerizable monomers or oligomers, which constitute component (d) of the IR-sensitive composition, are compounds having at least one ethylenically unsaturated bond. These compounds include, for example, acrylic or methacrylic acid derivatives with one or more unsaturated groups, preferably esters or amides of acrylic or methacrylic acid in the form of monomers, oligomers or prepolymers. These compounds may be present in solid or liquid form, with solid and highly viscous forms being preferred.

The compounds suitable as monomers include for instance trimethylol propane triacrylate and methacrylate, pentaerythritol triacrylate and methacrylate, dipentaerythritol monohydroxy pentaacrylate and methacrylate, dipentaerythritol hexaacrylate and methacrylate, pentaerythritol tetraacrylate and methacrylate, ditrimethylol propane tetraacrylate and methacrylate, diethyleneglycol diacrylate and methacrylate, triethyleneglycol diacrylate and methacrylate or tetraethyleneglycol diacrylate and methacrylate. Suitable oligomers and/or prepolymers also include urethane acrylates and methacrylates, epoxide acrylates and methacrylates, polyester acrylates and methacrylates, polyether acrylates and methacrylates or unsaturated polyester resins. Monomeric amides of an aliphatic polyamine compound with an unsaturated carboxylic acid may also be used. Examples include methylenebisacrylamide and methylenebismethacrylamide, 1,6-hexamethylenebisacrylamide and 1,6-hexamethylenebismethacrylamide, or diethylenebisacrylamide and diethylenebismethacrylamide.

In addition to monomers and oligomers, organic linear high molecular weight polymers having C═C bonds in the backbone, in the side chains, or in both the backbone and the side chains, can be used in the present invention. The organic linear high molecular weight polymer is preferably soluble or swellable in water to enable on-press development. Examples of suitable organic linear high molecular weight polymers include: reaction products of maleic anhydride-olefin-copolymers and hydroxyalkyl(meth) acrylates, polyesters containing an allyl alcohol group, reaction products of polymeric polyalcohols and isocyanate (meth)acrylates, unsaturated polyesters and (meth)acrylate terminated polystyrenes, poly(meth)acrylics and polyethers. Such polymers may be used alone or in combinations with the above discussed monomers or oligomers.

The weight ratio of the free radical polymerizable monomers, oligomers or polymers is preferably between about 35 and about 60 wt.-%, more preferably between about 45 and about 55 wt.-%, based on the total solids content of the IR-sensitive composition.

The IR-sensitive composition of the invention may optionally further comprise a leuco dye. Leuco dyes are one class of materials that form a dye upon oxidation. As used herein, a leuco dye is the reduced form of a dye that is generally colorless or very lightly colored and is capable of forming a colored image upon oxidation of the leuco dye to the dye form. Any leuco dye that converts to a differently colored form upon the removal of one or more hydrogen atoms is useful in the present invention.

Preferred leuco dyes includes those in which the removable hydrogen(s) are not sterically hindered. The leuco forms of the dyes are preferably selected from triarylmethanes, xanthenes, thioxanthenes, 9,10-dihydroacridines, phenoxazines, phenothiazines, dihydrophenazines, hydrocinnamic acids, indigoid dyes, 2.3-dihydroanthraquinones, phenylethylanilines and indanones. Such compounds have been described, for example, in U.S. Pat. No. 3,359,109 and EP-A 941,866.

It is also within the scope of the present invention to use a mixture of two or more leuco dyes.

If present, the leuco dye is preferably present in the IR sensitive composition in an amount ranging from about 0.5 to about 8 wt. % based on the total solids content of the IR sensitive composition, more preferably from about 1 to about 5 wt. % and most preferably from about 1.5 to about 4 wt. %.

The IR-sensitive compositions of the present invention may furthermore comprise a softening agent. Suitable softening agents include dibutyl phthalate, triaryl phosphate and dioctyl phthalate. If a softening agent is used, it is preferably present in an amount in the range of about 0.25 to about 2 wt.-%.

The IR-sensitive composition may furthermore comprise colorants for improving the color contrast between image area and non-image area. Suitable colorants are those that dissolve well in the solvent or solvent mixture used for coating or are easily introduced in the disperse form of a pigment, and include rhodamine dyes, triarylmethane dyes, anthraquinone pigments and phthalocyanine dyes and/or pigments. In a preferred embodiment of the present invention, no colorants are present if a leuco dye is used, since the leuco dye provides excellent color contrast between the image areas and non-image areas so that no colorant is necessary. Inorganic fillers or other known additives may also be incorporated into the IR-sensitive composition in order to improve the physical properties of the cured coatings. The IR-sensitive composition may further contain inhibitors for suppressing a thermal polymerization. Inhibitors in accordance with the present invention include, for example, 4-methoxyphenol, hydroquinone, alkyl and acyl-substituted hydroquinones and quinones, tert-butylcatechol, pyrrogallol, naphthyl amines, β-naphthol, 2,6-di-tert-butyl-4-methyl phenol and phenothiazine.

The IR-sensitive compositions of the present invention are preferably usable for the manufacture of printing plate precursors. In addition, however, they may be used in recording materials for creating images on suitable carriers and receiving sheets, for creating reliefs that may serve as printing plates, screens and the like, as etch resists, as radiation-curable varnishes for surface protection and for the formulation of radiation-curable printing inks.

In the case where the IR-sensitive composition of the present invention is applied to a support, a dimensionally stable plate, sheet or film may be used as support. Examples of the support include, for example, paper, paper laminated with plastic, a metal plate (e.g., aluminum, aluminum alloy, zinc, copper), a plastic film (e.g., cellulose derivatives, polyethylene terephthalate, polycarbonates, polyvinyl acetates) and paper or a plastic film laminated or vapor-deposited with the above mentioned metals.

For the manufacture of offset printing plate precursors, known substrates can be used; the use of an aluminum substrate is especially preferred. When an aluminum substrate is used it is preferably first roughened by brushing in a dry state, brushing with an abrasive suspension or electrochemically, for example in a hydrochloric acid electrolyte. The roughened plates, which are first optionally anodically oxidized in sulfuric or phosphoric acid, are then subjected to a hydrophilizing aftertreatment, preferably in an aqueous solution of polyvinylphosphonic acid or phosphoric acid. The details of the above-mentioned substrate pretreatment are well-known to the person skilled in the art.

The dried plates are then coated with the inventive IR-sensitive compositions from organic solvents or solvent mixtures such that dry layer weights of preferably between about 0.5 and about 4 $g/m^2$, more preferably between about 1 and about 1.5 $g/m^2$, are obtained.

On top of the IR-sensitive layer, an oxygen-impermeable layer is applied. Preferred examples of the oxygen-impermeable layer include layers of: polyvinyl alcohol, polyvinyl alcohol/polyvinyl acetate copolymers, polyvinyl pyrrolidone, polyvinyl pyrrolidone/polyvinyl acetate copolymers, polyvinyl methylether, polyacrylic acid, polyvinylimidazole and gelatine. These polymers can be used alone or as combinations.

The dry layer weight of the oxygen-impermeable layer is preferably between about 0.1 and about 4 $g/m^2$, more preferably between about 0.3 and about 2 $g/m^2$. This topcoat is not only useful as an oxygen barrier but also protects the plate against ablation during exposure to IR radiation.

Alternatively, a derivative of a higher fatty acid, such as behenic acid, behenic acid amide, or N,N'-diallyl tartardiamide may be incorporated in the IR-sensitive composition whereby these derivatives separate to form a layer of the derivative on the surface of the IR-sensitive layer and thereby also act as an oxygen barrier. The amount of the higher fatty acid derivative to be added is preferably from about 0.5 to about 10% by weight of the total amount of the components of the IR-sensitive composition.

The printing plate precursors can be exposed with semiconductor lasers or laser diodes which emit in the range of 800 to 1,100 nm. Such a laser beam can be digitally controlled via a computer, i.e. it can be turned on or off so that an imagewise exposure of the plates can be effected via stored digitalized information in the computer. Therefore, the IR-sensitive compositions of the present invention are suitable for creating what is referred to as computer-to-plate (ctp) printing plates.

The plates are then developed on-press without a separate development step. This is achieved by mounting the exposed plates on a plate cylinder of a printing press. When this cylinder rotates, the plates come into contact successively with rollers wet by a fountain solution and rollers wet by ink. The fountain and ink solution contacts the plates, leading to an interaction of both with the top layer. After removal of at least a portion of the top layer, the fountain and ink solution contacts the exposed and non-exposed regions of the bottom layer consisting of the IR-sensitive composition. As a consequence, the coating components of the non-exposed regions are removed and deposited onto the initial units of receiving media (for example, paper). When all this material is removed, the ink likewise contacts the exposed regions and is subsequently transferred to the receiving medium. Accordingly, the IR-sensitive composition of this invention is configured so that the non-exposed regions are removable on-press.

It is noted that plates designed for on-press development can also be developed with a conventional process using a suitable aqueous developer. The plates disclosed in this invention include on-press developable plates as well as plates which are intended for other development processes.

The following examples serve to provide a more detailed explanation of the invention.

EXAMPLE 1

A coating solution for the bottom, IR-sensitive layer was prepared from the components described in Table 1. The solution was applied to an aluminum substrate, which was brush grained with quartz, etched in alkali, anodized in phosphoric acid and hydrophilized with polyvinylphosphonic acid (PVPA), where the amount of PVPA deposited is 14 mg/$m^2$. The solution was applied with a bar coater and dried at 90° C. for 5 minutes, resulting in an IR-sensitive layer having a dry coating weight of 1.7 g/$m^2$.

A coating solution for the top, oxygen-impermeable layer was prepared from the components described in Table 2. The solution was applied over the IR-sensitive layer to provide a topcoat layer. The resulting two-layer imageable coating was dried at 90° C. for 5 minutes. The dry coating weight of the topcoat layer was 0.3 g/$m^2$.

TABLE 1

| Components of the coating solution for the bottom, IR-sensitive layer (the supplier is given in parenthesis) | |
|---|---|
| 0.012 g | Stabilizer, 2,6-di-t-butyl-4-methylphenol (Aldrich) |
| 0.004 g | Stabilizer, benzenepropanoic acid 3,5-(bis-1,1-dimethylethyl)-4-hydroxy-thiodi-2,1-ethanediylester (IRGANOX ® 1035, Rohm & Haas) |
| 0.96 g | Methyl methacrylate polymer A11 (Rohm & Haas) |
| 0.29 g | Acrylated urethane (Ebecryl 8301, UCB Chemie) |
| 2.00 g | Dipentaerythritol pentaacrylate (Sartomer 399, Cray Valley) |
| 0.39 g | Ethylene oxide/Propylene oxide copolymer in a ratio of about 30/70% by weight and having an average molecular weight of 1850 (PLURONIC ® L43, BASF) |
| 3.1 g | Reactive binder, urethane copolymer WS 96 (50% in Dowanol PMA) (Panchim) |
| 2.90 g | Urethane acrylate oligomer (Bomar) |
| 0.16 g | Leuco dye, bis-(4-diethylamino-o-tolyl)-(4-diethylaminophenyl)methane (Hernfold Research) |
| 0.10 g | Leuco dye, leuco crystal violet (Merck) |
| 0.084 g | IR Dye, 2-[2-[2-thiophenyl-3-[2-(1,3-dihydro-1,3,3-trimethyl-2H-indol-2-ylidene)-ethylidene]-1-cyclohexen-1-yl]-ethenyl]-1,3,3-trimethyl-3H-indoliumchloride (IR Dye 66e, Freundorfer) |
| 0.376 g | 2-(4-methoxyphenyl)-4,6-bis(trichloromethyl)-s-triazine, Triazine A (Panchim) |
| 0.20 g | N-phenyliminodiacetic acid (Lancaster) |
| 55.8 g | Methyl ethyl ketone |
| 7.0 g | n-butanol |

TABLE 2

| Components of the coating solution for the top, oxygen-impermeable layer (the supplier is given in parenthesis): | |
|---|---|
| 1.060 g | Polyvinyl alcohol (AIRVOL 603 ®, Air Products) |
| 0.061 g | Sodium gluconate (Aldrich) |
| 0.015 g | Nonylphenylpolyoxyethylene ether (TRITON ® X100, Rohm & Haas) |
| 0.014 g | Metanyl yellow, 3-(4-anilinophenyl)-azobenzenesulfonic acid (Aldrich) |

TABLE 2-continued

| Components of the coating solution for the top, oxygen-impermeable layer (the supplier is given in parenthesis): | |
|---|---|
| 0.009 g | sulfo-butanedioic acid, 1,4-bis(2-ethylhexyl)ester dissolved in a 1:1 mixture of methanol and water (Aerosol T ester (Cytec Industries)) |
| 0.16 g | sodium polymetaphosphate (31 wt. - % aqueous solution added to top coat solution) |
| 0.039 g | Methanol |
| 71.5 g | Water |

The resulting printing plate precursor was exposed in the near IR spectral region at about 830 nm using a Trendsetter 3244 AL having a 20 Watt head (available from Creo) with a dose of 200 mJ/$cm^2$ and mounted on an offset, printing press (available from Roland Favorit). The plates were predeveloped with 15 roll-ups of fountain solution (10% isopropyl alcohol, 5% COMBIFIX (available from Hostmann-Steinberg) and 15 roll-ups of CORA S ink (available from Hartmann), before the printing started. After about 100 impressions, the unexposed coating was totally removed and the printing was continued to provide about 800 clean impressions with little noticeable plate wear. It is believed that the plate could have been used for more prints.

EXAMPLE 2

A printing plate precursor was prepared and exposed according to the procedure of Example 1. One of the images used for exposure was the UGRA/FOGRA postscript control strip at 2400 dpi and 60 lpi. Instead of developing the plate in a printing machine, it was developed by hand with the negative developer 952 (available from Kodak Polychrome Graphics LLC). The development was carried out for 30 seconds by rubbing the plate with a cotton pad that was soaked with the developer, and afterwards rinsing it with water.

A plate developed by hand was compared to the plate of Example 1 after 100 roll-ups in the printing machine and removing the applied ink. No difference in resolution between these two plates could be observed. 3 to 97% of the dots were measured with a D19C Densitometer (Gretag/Macbeth) on both plates. This experiment indicates that development in a printing machine with ink and fountain can be simulated by hand development using developer 952 and water.

EXAMPLE 3

Printing plate precursors were prepared as described in Example 1, except that the aluminium substrate was prepared by several different procedures. Substrate A corresponds to the substrate of Example 1. Substrate B was prepared by electrochemical graining in hydrochloric acid, etched with sodium phosphate, anodized in sulfuric acid and hydrophilized with PVPA (deposited PVPA 12 mg/$m^2$). Substrate C was prepared by the procedure used for substrate B, except that substrate C was hydrophilized to a lesser extent (deposited PVPA 8 mg/$M^2$). Substrate D was prepared by the procedure used for substrate B, except that substrate D was not hydrophilized with PVPA. Substrate E was prepared by electrochemical graining with hydrochloric acid, etched with sodium hydoxide, anodized with sulfuric acid and hydrophilized with PVPA (deposited PVPA 17 mg/$m^2$). Substrate F was prepared by the procedure utilized for substrate E, except that substrate F was not hydrophilized with PVPA.

The resulting printing plate precursors were IR exposed, as described in Example 1, and hand-developed using Kodak Polychrome Graphics 952 developer. Adhesion of the exposed areas to each of the substrates was evaluated during the development process by ease of removal of the exposed coating from the substrate. Based on this criterion, adhesion was found to decrease in the order of substrate A>D>C>F>B>E.

EXAMPLE 4

Printing plate precursors were prepared and IR exposed in the range of about 100–500 mJ/cm$^2$, as described in Example 1, and hand developed, using developer 952, as described in Example 2, except that substrate C was utilized. The concentration of the IR dye in the IR-sensitive layer was varied in the range of 0.5–3% by weight of the dried coating weight of 1.7 g/m$^2$. As the concentration of dye was increased above 2% by weight, developer attack of the exposed image layer tended to increase. This attack is the stronger the lower the exposure energy used. The coating weight of the dried IR sensitive layer was also varied in the range of 0.8–1.7 g/m$^2$. Resolution tended to increase with decreasing weight; but developer attack of the exposed image layer tended to increase with decreasing coating weight.

EXAMPLE 5

One set of printing plate precursors was prepared and exposed as described in Example 1, and further hand-developed as described in Example 2, except that substrate C was utilized. Another set was prepared and exposed as described in Example 1, and heated at 90° C. for 2 minutes, followed by hand-development. No significant performance difference was observed between the plates with and without the preheating step, following exposure.

EXAMPLE 6

Plate precursors were prepared as described in Example 1, except that AIRVOL 603® polyvinyl alcohol was replaced by a mixture of AIRVOL 203® (Air Products) and polyvinyl imidazole available from Panchim in a ratio of 85:15 by weight in the topcoat and substrate B was utilized. AIRVOL 603® was also replaced by MOWIOLO® 4/98 and MOWIOL® 4/88, both available from Clariant, and both having higher extent of hydrolysis than AIRVOL 603®. IR exposure, using a range of doses from about 100 to about 500 mJ/cm$^2$, was followed by hand development using developer 952 described above. Processed plates being topcoated with the AIRVOL 203®/polyvinyl imidazole mixture provided the highest resistance to image attack by the developer.

EXAMPLE 7

Plate precursors were prepared as described in Example 1, except that N,N'-diallyl tartardiamide (5% by weight) (Aldrich) was added to the IR sensitive layer and no topcoat was used. IR exposure, followed by hand-development using developer 952, provided results comparable to Example 1.

COMPARATIVE EXAMPLE 1

A coating solution was prepared in accordance with the description of U.S. Pat. No. 6,309,792. The following components were used:

| | |
|---|---|
| 3.0 g | IONCRYL 683 ® (acrylic copolymer from SC Johnson & Son Inc. having and acid number of 175 mg KOH/g) |
| 4.4 g | AC 50 (methacrylic copolymer available from PCAS having an acid number of 48 mg KOH/g as a 70% solution by weight in methyl glycol |
| 1.4 g | Dipentaerythritol pentaacrylate |
| 8.4 g | 80 wt. - % methyl ethyl ketone solution of a urethane acrylate prepared by reacting 1-methyl-2,4-bis-isocyanate benzene (DESMODUR N100 ® available from Bayer) with hydroxy ethyl acrylate and pentaerythritol triacrylate having a double-bond content of about 0.50 double bonds/100 g when all isocyanate groups are completely reacted |
| 0.4 g | N-phenylimino diacetic acid (Lancaster, UK) |
| 0.25 g | 2-[2-[2-thiophenyl-3-[2-(1,3-dihydro-1,3,3-trimethyl-2H-indol-2-ylidene)-ethylidene]-1-cyclohexen-1-yl]-ethenyl]-1,3,3-trimethyl-3H-indoliumchloride (IR Dye 66e (Freundorfer, Germany)) |
| 0.75 g | 2-(4-methoxyphenyl)-4,6-bis-(trichloromethyl)-s-triazine (Triazine A (Panchim, France)) |
| 0.3 g | RENOL BLUE B2G HW ® (copper phthalocyanine pigment preparation with polyvinyl butyral (Clairant)) |

These components were dissolved under stirring in 100 mL of a mixture comprising 30 parts by volume of methyl glycol, 45 parts by volume of methanol, and 25 parts by volume of methyl ethyl ketone.

After filtration, the solution was applied to the substrate used in Example 1 and the coating was dried for 4 minutes at 90° C. The dry weight of the radiation-sensitive layer amounted to approximately 2 g/m$^2$. An oxygen-impermeable layer of 2 g/m$^2$ dry layer weight was then applied by applying a coating of a solution of the following composition:

| | |
|---|---|
| 42.5 g | polyvinyl alcohol (AIRVOL 203 ® available from Air Products; 12 wt. - % residual acetyl groups) |
| 7.5 g | polyvinyl imidazole (PVI available from Panchim) |
| 170 g | water. |

Drying took place for 5 minutes at 90° C.

The resulting printing plate precursor was exposed as described in Example 1, and then hand developed with developer 980 (available from Kodak Polychrome Graphics LLC). After soaking for 20 seconds and rubbing for an additional 20 seconds, no coating was left on the substrate. Another printing plate precursor was heated after exposure for 2 minutes at 90° C. and then mounted on an offset printing press (Roland Favorit). The plate could not be "predeveloped" even with 100 roll-ups of fountain solution (10% isopropyl alcohol, 5% COMBIFIX) and 15 roll-ups of ink (CORA S, Hartmann).

The results of this Comparative Experiment show that polymeric binders comprising a carboxylic group cannot be used as components of on-press developable printing plate formulations.

COMPARATIVE EXAMPLE 2

Plate precursors were prepared as described in Example 1, except that a quencher polymer, KA41 (7.12 g of a 1.67% aqueous solution) (Polaroid) was added to the topcoat. The resulting precursors were exposed as described in Example 1, except that the exposure dose was 300 mJ/cm$^2$, followed by mounting on an offset printing press and pre-developed" as described in Example 1. As in Example 1, the unexposed coating was removed after about 100 impressions and the printing was continued. However, in contrast to Example 1, the plate already exhibited excessive wear after about 300 impressions, even though the exposure dose was 300 mJ/$cm^2$, compared to 200 mJ/$cm^2$ for Example 1.

Furthermore, hand development using developer 952 of the exposed plate precursors of Comparative Example 2 resulted in greater image attack compared to the exposed plate precursors of Example 1.

The results of this Comparative Example show that the use of quencher polymers in the top layer leads to less IR sensitive printing plate precursors having lower lengths of print run.

Although the present invention has been described in connection with specific exemplary embodiments, it should be understood that various changes, substitutions and alterations can be made to the disclosed embodiments without departing from the spirit and scope of the invention as set forth in the appended claims.

We claim:

1. An infrared radiation-sensitive composition comprising:

(a) a first polymeric binder which is free of acidic moieties;

(b) a second polymeric binder comprising polyether moieties;

(c) an initiator system comprising:

(i) at least one infrared radiation absorbing material comprising a triarylamine dye, thiazolium dye, indolium dye, oxazolium dye, cyanine dye, polyaniline dye, polypyrrole dye, polythiophene dye or phthalocyanine pigment;

(ii) at least one polyhaloalkyl-substituted compound capable of producing radicals, wherein $$ox_{(i)} < red_{(ii)} + 1.6 \text{ eV}$$

and wherein $ox_i$ is the oxidation potential of the infrared radiation absorbing material in eV and $red_{(ii)}$ is the reduction potential of the polyhaloalkyl-substituted compound in eV; and (iii) at least one compound represented by the formula I $$R^4—(CR^5R^6)_r—Y—CH_2COOH \quad (I)$$

wherein Y is O, S or $NR^7$, each of $R^4$, $R^5$ and $R^6$ is independently hydrogen, $C_1$–$C^4$ alkyl, substituted or unsubstituted aryl, —COOH or $NR^8CH_2COOH$, $R^7$ is a hydrogen, $C^1$–$C^6$ alkyl, —$CH_2CH_2OH$, or $C_1$–$C_5$ alkyl substituted with —COOH, $R^8$ is —$CH_2COOH$, —$CH_2OH$ or —$(CH_2)_2N(CH_2COOH)_2$, and r is 0, 1, 2 or 3, and wherein at least one of $R^4$, $R^5$, $R^6$, $R^7$ and $R^8$ comprises a —COOH moiety or salts thereof; and (d) a free radical polymerizable system comprising at least one unsaturated free radical polymerizable monomer, free radical polymerizable oligomer, or a polymer containing C═C bonds in the back bone, side chains, or both.

2. The infrared radiation-sensitive composition of claim 1, wherein the infrared radiation absorbing material comprises a cyanine dye.

3. The infrared radiation-sensitive composition of claim 1, wherein the infrared radiation absorbing material is represented by the formula

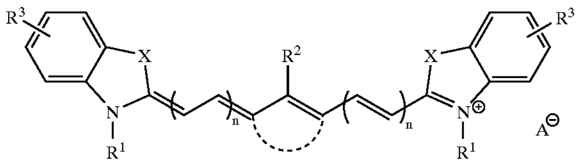

wherein each X is independently S, O, NR or C(alkyl)$_2$; each $R^1$ is independently alkyl, alkylsulfonate or alkylammoniun; $R^2$ is hydrogen, halogen, SR, $SO_2R$, OR or $NR^2$; each $R^3$ is independently hydrogen, alkyl, COOR, OR, SR, $NR_2$, halogen or optionally substituted beazofused ring; A is an anion; the dashed line (---) completes an optional carbocyclic five- or six-member ring; each R is independently hydrogen, alkyl or aryl; and each n is independently 0, 1, 2 or 3.

4. The infrared radiation-sensitive composition of claim 1, wherein the infrared radiation absorbing material comprises:

2-[2-[2-thiophenyl-3-[2-(1,3-dihydro-1,3,3-trimethyl-2H-indol-2-ylidene)-ethylidene]-1-cyclopenten-1-yl]-ethenyl]-1,3,3-trimethyl-3H-indolium tosylate;

2-[2-[2-phenylsulfonyl-3-[2-(1,3-dihydro-1,3,3-trimethyl-2H-indol-2-ylidene)ethylidene]-1-cyclohexen-1-yl]-ethenyl]-1,3,3-trimethyl-3H-indolium chloride;

2-[2-[2-thiophenyl-3-[2-(1,3-dihydro-1,3,3-trimethyl-2H-indol-2-ylidene)-ethylidene]-1-cyclohexen-1-yl]-ethenyl]-1,3,3-trimethyl-3H-indolium chloride;

2-[2-[2-chloro-3-[2-(1,3-dihydro-1,3,3-trimethyl-2H-indol-2-ylidene)-ethylidene]-1-cyclohexen-1-yl]-ethenyl]-1,3,3-trimethyl-3H-indolium tosylate; or 2-[2-[2-chloro-3-[2-ethyl-(3H-benzothiazol-2-ylidene)-ethylidene]-1-cyclohexen-1-yl]-ethenyl]-3-ethyl-benzothiazolium tosylate.

5. The infrared radiation-sensitive composition of claim 1, wherein the polyhaloalkyl-substituted compound comprises 2-(4-methoxyphenyl)-4,6-bis-(trichloromethyl)-s-triazine, 2-(4-chlorophenyl)-4,6-bis-(trichoromethyl)-s-triazine, 2-phenyl-4,6-bis-(trichloromethyl)-s-triazine, 2,4,6-tri-(trichloromethyl)-s-triazine, 2,4,6-tri-(tribromomethyl)-s-triazine, or tribromomethyl phenylsulfone.

6. The infrared radiation-sensitive composition of claim 1, wherein the compound represented by formula I comprises a compound represented by formula (B)

(B)

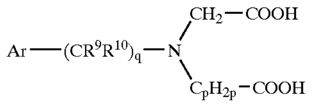

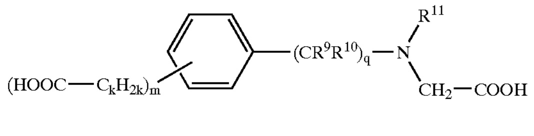

or a compound represented by formula C wherein Ar is a mono-, poly- or unsubstituted axyl group, p is an intege (C) 1 to 5, each $R^9$ and $R^{10}$ is independently hydrogen or $C_1$–$C_4$ alkyl, q is 0 or an integer from 1 to 3, and wherein $R^{11}$ is hydrogen or $C_1$–$C_6$ alkyl, and k and m each are an integer from 1 to 5.

7. The infrared radiation-sensitive composition of claim 1, wherein the compound represented by formula I comprises anilino diacetic acid or N-(carboxymethyl)-N-benzyl-glycine.

8. The infrared radiation-sensitive composition of claim 1, wherein the first polymeric binder comprises a main chain comprising at least one ester group or urethane group.

9. The infrared radiation-sensitive composition of claim 1, wherein the polyether groups of the second polymeric binder are derived from polyoxy alkylenes.

10. The infrared radiation-sensitive composition of claim 9, wherein the polyoxy alkylenes comprise ethylene oxide or propylene oxide.

11. The infrared radiation-sensitive composition of claim 1, wherein the polyether groups of the second polymeric binder comprise at least one end group comprising —OH.

12. The infrared radiation-sensitive composition of claim 1, further comprising a leuco dye comprising a triarylmethane, thioxanthene, 9,10-dihydro-acridine or phenoxazine dye.

13. The infrared radiation-sensitive composition of claim 1, further comprising at least one coloran comprising a rhodamine dye, triarylmethane dye, anthraquinone pigment, phthalocyanine dye, or a pigment.

14. The radiation sensitive-sensitive composition of claim 1, further comprising at least one softening agent.

15. The infrared radiation-sensitive composition of claim 1 comprising between about 3 and 30 weight percent of the second polymeric binder based on the total solids content of the composition.

16. The infrared radiation-sesitive composition of claim 1 comprising between about 10 and 20 weight percent of the second polymeric binder based on the total solids content of the composition.

17. The infrared radiation-sensitive composition of claim 1 wherein the first polymeric material is derived from at least one monomer selected from the group consisting of 2-hydroxyethyl acrylate, 2-hydroxmethyl methacrylate, methacrylate, methylmethacrylate, N-dimethylaminoethylacrylate and N-dimethylaminoethylmethacrylate.

18. The infrared radiation-sensitive composition of claim 1 wherein the first polymeric material is derived from at least one monomer selected from the group consisting of acrylamide, methacrylamide, N-methylolacrylamide, N-hydroxyethylacrylamide and N-ethylacrylamide.

19. The infrared radiation-sensitive composition of claim 1 wherein the first polymeric material comprises at least one of polyesters or polyurethanes.

20. A printing plate precursor comprising:

(A) a substrate;

(B) a negative-working bottom layer applied onto the substrate, comprising an IR-sensitive composition comprising a first polymeric binder which is free of acidic moieties, a second polymeric binder comprising polyether moieties and an initiator system comprising:

(i) at least one infrared radiation absorbing material comprising a txiarylaxnine dye, thiazolium dye, indolium dye, oxazolium dye, cyanine dye, polyaniline dye, polypyrrole dye, polythiophene dye or phthalocyanine pigment;

(ii) at least one polyhaloalkyl-substituted compound capable of producing radicals, wherein $$ox_{(i)} < red_{(ii)} + 1.6 \text{ eV}$$

and wherein $ox_i$ is the oxidation potential of the infrared radiation absorbing material in eV and $red_{ii}$ is the reduction potential of the polyhaloalkyl-substituted compound in eV; and (iii) at least one compound represented by the formula I $$R^4—(CR^5R^6)_r—Y—CH_2COOH \qquad (I)$$

wherein Y is O, S or $NR^7$, each of $R^4$, $R^5$ and $R^6$ is hydrogen, $C_1$–$C_4$ alkyl, substituted or unsubstituted aryl, —COOH or $NR^8CH_2COOH$, $R^7$ is $C_1$–$C_6$ alkyl, —$CH_2CH_2OH$, or C1–C5 alkyl substituted with —COOH, $R^8$ is —$CH_2COOH$, —$CH_2OH$ or —$(CH_2)_2N(CH_2COOH)_2$, and r is 0, 1, 2 or 3, and wherein at least one of $R^4$, $R^5$, $R^6$, $R^7$ and $R^8$ comprises a —COOH moiety or salts thereof;

(C) a free radical polymerizable system comprising at least one unsaturated free radical polymerizable monomer, free radical polymerizable oligomer, or a polymer containing C═C bonds in the back bone, in the side chain or both, (D) an oxygen-impermeable top layer applied onto the bottom layer, wherein the printing plate precursor is free of an infrared radiation-ablatable layer.

21. The printing plate precursor of claim 20, wherein the oxygen-impermeable layer comprises polyvinyl alcohol.

22. The printing plate precursor of claim 20, wherein the oxygen-impermeable layer comprises behenic acid, behenic acid amide, or N,N'-diallyl tartardiamide.

23. The printing plate precursor of claim 20 wherein the second polymeric material comprises between about 3 and about 30 weight percent of the radiation-sensitive layer.

24. The printing plate precursor of claim 20 wherein the second polymeric material comprises between about 10 and about 20 weight percent of the radiation-sensitive layer.

25. A method for preparing an on-press developable printing plate, the method comprising:

(A) providing a substrate;

(B) applying a negative-working bottom layer comprising an infrared radiation-sensitive composition onto the substrate to form a printing plate precursor, wherein the radiation sensitive-composition comprises a first polymeric binder which is free of acidic moieties, a second polymeric binder comprising polyether moieties, an initiator system comprising at least one infrared radiation absorbing material, at least one compound capable of producing radicals and at least one compound represented by the formula I $$R^4—(CR^5R^6)_r—Y—CH_2COOH \qquad (I)$$

wherein Y is O, S or $NR^7$, each of $R^4$, $R^5$ and $R^6$ is hydrogen, $C_1$–$C_4$ alkyl, substituted or unsubstituted aryl, —COOH or $NR^8CH_2COOH$, $R^7$ is hydrogen, $C_1$–$C_6$ alkyl, —$CH_2CH_2OH$, or C1–C5 alkyl substituted with —COOH, $R^8$ is —$CH_2COOH$, —$CH_2OH$ or —$(CH_2)_2N(CH_2COOH)_2$, and r is 0, 1, 2 or 3, and wherein at least one of $R^4$, $R^5$, $R^6$, $R^7$ and $R^8$ comprises a —COOH moiety or salts thereof; and a free radical polymerizable system;

(C) applying an oxygen-impermeable top layer onto the bottom layer;

(D) imagewise exposing the printing plate precursor to infrared radiation; and (E) developing the imagewise exposed printing plate precursor on-press without a separate development step or heating step, and wherein the printing plate is free of infrared radiation laser ablatable layer.

26. The method of claim 25, wherein the initiator system further comprises (i) at least one infrared radiation absorbing material comprising a triarylamine dye, thiazolium dye, indolium dye, oxazolium dye, cyanine dye, polyaniline dye, polypyrrole dye, polythiophene dye or phthalocyanine pigment;

(ii) at least one polyhaloalkyl-substituted compound capable of producing radicals, wherein $$ox_{(i)}<red_{(ii)}+1.6\text{ eV}$$

and wherein $ox_i$ is the oxidation potential the infrared radiation absorbing material in eV and $red_{ii}$ is the reduction potential of the polyhaloalkyl-substituted compound in eV; and wherein the free radical polymerizable system comprises at least one unsaturated free radical polymerizable monomer, free radical polymerizable oligomer, or a polymer containing C═C bonds in the backbone, side chains or both.

27. A printing plate precursor comprising:

a substrate;

an infrared radiation-sensitive layer comprising:

a first polymeric binder; that is free of acidic groups, a second polymeric binder comprising polyether moieties, an initiator system comprising an infrared radiation absorber, at least one compound capable of producing free radicals and at least one polycarboxylic compound; and a free radical polymerizable system.

28. The printing plate precursor of claim 27, further comprising an oxygen-impermeable layer applied onto the infrared radiation-sensitive layer.

29. The printing plate precursor of claim 27 wherein the second polymeric material comprises between about 3 and about 30 weight percent of the radiation-sensitive layer.

30. The printing plate precursor of claim 27 wherein the second polymeric material comprises between about 10 and about 20 weight percent of the radiation-sensitive layer.

31. An infrared radiation-sensitive composition comprising:

(d) a first polymeric binder comprising at least one acrylate, methacrylate, acrylamide or methacrylamide.

(e) a second polymeric binder comprising polyether moieties;

(f) an initiator system comprising:

(i) at least one infrared radiation absorbing material comprising a triarylamine dye, thiazolium dye, indolium dye, oxazolium dye, cyanine dye, polyaniline dye, polypyrrole dye, polythiophene dye or phthalocyanine pigment;

(ii) at least one polyhaloalkyl-substituted compound capable of producing radicals, wherein $$ox_{(i)}<red_{(ii)}+1.6\text{ eV}$$

and wherein $ox_i$ is the oxidation potential of the infrared radiation absorbing material in eV and $red_{ii}$ is the reduction potential of the polyhaloalkyl-substituted compound in eV; and (iii) at least one compound represented by the formula I $$R^4—(CR^5R^6)_r—Y—CH_2COOH \quad (I)$$

wherein Y is O, S or $NR^7$, each of $R^4$, $R^5$ and $R^6$ is independently hydrogen, $C_1$–$C_4$ alkyl, substituted or unsubstituted aryl, —COOH or $NR^8CH_2COOH$, $R^7$ is a hydrogen, $C_1$–$C_6$ alkyl, $—CH_2CH_2OH$ or $C_1$–$C_5$ alkyl substituted with —COOH, $R^8$ is $—CH_2COOH$, $—CH_2OH$ or $—(CH_2)_2N(CH_2COOH)_2$, and r is 0, 1, 2 or 3, and wherein at least one of $R^4$, $R^5$, $R^6$, $R^7$ and $R^8$ comprises —COOH moiety or salts thereof; and (d) a free radical polymerizable system comprising at least one unsaturated free radical polymerizable monomer, free radical polymerizable oligomer, or a polymer containing C═C bonds in the back bone, side chains, or both.

* * * * *

UNITED STATES PATENT AND TRADEMARK OFFICE

CERTIFICATE OF CORRECTION

PATENT NO. : 6,846,614 B2 Page 1 of 1
DATED : January 25, 2005
INVENTOR(S) : Hans-Joachim Timpe et al.

It is certified that error appears in the above-identified patent and that said Letters Patent is hereby corrected as shown below:

Column 20,
Line 13, after the word "ring;" delete the letter "A" and replace it with -- $A^{\theta}$ --.
Line 59, delete the word "axyl" and replace it with -- aryl --.
Line 60, delete the phrase "intege" and replace it with -- integer from --.

Column 21,
Line 17, delete the word "coloran" and replace it with -- colorant --.
Line 20, delete the phrase "radiation sensitive-sensitive" and replace it with -- radiation-sensitive --.
Line 52, delete the word "txiarylaxnine" and replace it with -- triarylamine --.

Column 22,
Line 14, delete the word "chain" and replace it with -- chains --.

Column 23,
Line 23, delete the ";" after the word "binder".

Column 24,
Line 32, after the word "comprises" insert -- a --.

Signed and Sealed this

Tenth Day of May, 2005

JON W. DUDAS
*Director of the United States Patent and Trademark Office*